US008685284B2

(12) United States Patent
Das et al.

(10) Patent No.: US 8,685,284 B2
(45) Date of Patent: *Apr. 1, 2014

(54) CONDUCTING PASTE FOR DEVICE LEVEL INTERCONNECTS

(75) Inventors: Rabindra N. Das, Vestal, NY (US); Roy H. Magnuson, Endicott, NY (US); Mark D. Poliks, Vestal, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 323 days.

This patent is subject to a terminal disclaimer.

(21) Appl. No.: 12/884,657

(22) Filed: Sep. 17, 2010

(65) Prior Publication Data

US 2012/0069531 A1    Mar. 22, 2012

(51) Int. Cl.
*H01B 1/00* (2006.01)
*H01B 1/22* (2006.01)
*H01B 1/02* (2006.01)

(52) U.S. Cl.
USPC .................. 252/500; 252/514; 252/518.1

(58) Field of Classification Search
USPC .............. 252/500–521.6, 514, 518.1
See application file for complete search history.

(56) References Cited

U.S. PATENT DOCUMENTS

| | | | |
|---|---|---|---|
| 5,853,622 A * | 12/1998 | Gallagher et al. | 252/512 |
| 6,344,157 B1 * | 2/2002 | Cheng et al. | 252/512 |
| 6,669,079 B2 | 12/2003 | Li et al. | |
| 6,800,223 B2 * | 10/2004 | Kojo et al. | 252/514 |
| 7,081,214 B2 * | 7/2006 | Matsuba et al. | 252/512 |
| 7,341,680 B2 * | 3/2008 | Pan et al. | 252/500 |
| 7,691,175 B2 * | 4/2010 | Shimoda et al. | 75/255 |
| 2005/0093164 A1 | 5/2005 | Standing | |
| 2005/0194577 A1 * | 9/2005 | Kasuga et al. | 252/514 |
| 2007/0131912 A1 * | 6/2007 | Simone et al. | 252/500 |
| 2008/0202380 A1 * | 8/2008 | Bao et al. | 106/31.92 |
| 2008/0272344 A1 * | 11/2008 | Jiang et al. | 252/513 |
| 2009/0162557 A1 | 6/2009 | Lu et al. | |
| 2010/0009071 A1 * | 1/2010 | Chopra et al. | 427/123 |
| 2010/0140564 A1 * | 6/2010 | Overbreek et al. | 252/514 |

\* cited by examiner

*Primary Examiner* — Mark Kopec
*Assistant Examiner* — Jaison Thomas
(74) *Attorney, Agent, or Firm* — Mark Levy; Hinman, Howard & Kattell, LLP

(57) ABSTRACT

A conducting paste and method of forming the paste for device level interconnection. The conducting paste contains metal loading in the range 80-95% that is useful for making five micron device level interconnects. The conducting paste is made by mixing two different conducting pastes, each paste maintaining its micro level individual rich region in the mixed paste even after final curing. One paste contains at least one low melting point alloy and the other paste contains noble metal fillers such as gold or silver flakes. In general, average flake size below five micron is suitable for five micron interconnects. However, 1 micron or smaller silver flakes and an LMP mixture is preferred for five micron interconnects. The amount of LMP based paste in the final mixture is preferably 20-50% by weight. The nano micro paste embodiment shows good electrical yield (81%) and low contact resistance.

9 Claims, 11 Drawing Sheets

CONDUCTING PASTE FOR DEVICE LEVEL INTERCONNECTS

FIELD OF INVENTION

The present invention relates to electrically conducting paste for device level interconnects and methods of making same and, more specifically, to conducting paste that can be used for connecting micron interconnects, such as sensors or chips, for devices such as infrared (IR) camera systems.

BACKGROUND OF THE INVENTION

One of the steps of sensor fabrication when developing device systems such as are used for infrared (IR) cameras involves the use of a conducting paste to make connections between interconnects of the device. Historically, this junction of the connections between five micron device level interconnects, such as the sensor and the processor, has created a problem. Current commercially available paste makes it necessary to load a higher metal for sintering in these pastes, but a high loading system has no mechanical strength. However, even when a low metal loading system is used, no sintering occurs even at very high temperatures (e.g., 300° C.). Therefore, it is advantageous to have a conducting paste that shows a good electrical yield as well as low contact resistance in order to allow adhesion between the sensor and the processor of, for example, infrared cameras and the like while avoiding the aforementioned problems. This can be achieved by using a solvent free paste, such as described hereinbelow in the present invention, which paste can be cured and completely sintered at or below 200° C.

The existing prior art tends to deal with conducting paste that has the same problems as the commercially available paste listed above. None of the prior art discloses creating a conducting paste for interconnects that includes the same materials and method to connect micron interconnects such as sensors or chips. This again can be solved with a solvent free paste, such as disclosed in the present invention.

U.S. Pat. No. 6,669,079 for CONDUCTIVE PASTE AND SEMICONDUCTOR COMPONENT HAVING CONDUCTIVE BUMPS MADE FROM THE CONDUCTIVE PASTE by Li, et al. discloses a conductive paste to make conductive bumps on a substrate. The conductive paste is formed by combining a tin alloy with a flux composition containing an aromatic carboxylic acid fluxing agent and a solvent. The conductive paste is disposed on underbump metallization layers and reflowed to form the conductive bumps. This conductive paste uses a tin alloy and does not connect interconnects on a micro scale level. In addition, the paste is not made by mixing two different conducting pastes, where each paste maintains its own micro level individual rich region in the mixed paste even after final curing.

United States Patent Application No. 2009/0162557 published Jun. 25, 2009 for NANOSCALE METAL PASTE FOR INTERCONNECT AND METHOD OF USE by Lu, et al. discloses a paste including metal or metal alloy particles (which are preferably silver or silver alloy), a dispersant material, and a binder to form an electrical, mechanical or thermal interconnect between a device and a substrate. By using nanoscale particles (i.e., those which are less than 500 nm in size and most preferably less than 100 nm in size), the metal or metal alloy particles can be sintered at a low temperature to form a layer that allows good electrical, thermal and mechanical bonding. The metal or metal alloy layer can enable usage at a high temperature such as would be desired for SiC, GaN, or diamond wide bandgap devices. Furthermore, significant application of pressure to form the densified layers is not required, as would be the case with micrometer-sized particles. In addition, the binder can be varied so as to insulate the metal particles until a desired sintering temperature is reached, thereby permitting fast and complete sintering. Unlike the present invention, the '557 reference requires the presence of a dispersant in sufficient quantity to reduce or prevent agglomeration of the particles and a binder having a temperature of volatilization below the sintering temperature of the metal or metal alloy powder.

United States Patent Application No. 2005/0093164 published May 5, 2005 for PASTE FOR FORMING AN INTERCONNECT AND INTERCONNECT FORMED FROM THE PASTE by Maria Standing discloses a paste that includes a mixture of binder particles, filler particles and flux material. The binder particles have a melting temperature lower than that of the filler particles. The proportion of the binder particles and the filler particles is selected so that, when heat is applied to melt the binder particles, the shape of the paste as deposited is substantially retained thereby, allowing for the paste to be used for forming interconnect structures. The present invention does not contain binder particles or any parts that include tin-silver solder, such as prior art binder materials that contain 95.5% Sn, 3.8% Silver, and 0.7% Cu by weight.

The prior art listed above all deals with methods of forming electrically conducting paste, but none of the pastes or methods is similar to the present invention that forms a solvent free paste that can be cured and completely sinters at or below 200° C.

When performing the process of joining the connections between five micron device level interconnects, a conducting paste of choice is one that has a good electrical yield and a low contact resistance, such as the present invention.

SUMMARY OF THE INVENTION

Disclosed is a conducting paste for device level interconnects. More specifically, the invention is applicable to situations in which five micron level device interconnections, such as a sensor to processor interconnects, are necessary to form devices such as an infrared camera.

A conducting paste with metal loading in the range of 80-95% is obtained by mixing two different conducting pastes, in which each paste maintains its micro level individual rich region in the mixed paste even after final curing. One paste contains at least one low melting point alloy and the other paste contains noble metal fillers such as gold or silver flakes. Generally, the process is performed by embedding nano particles within a polymer constituent. Next, the polymer and nano particles are dissolved in an organic solvent which prevents sintering of the nano particles in the presence of the polymers.

Further, the noble metal fillers include an average flake size of five microns or smaller, which is suitable for five micron interconnects. However, for the best formation of the conducting paste for five micron interconnects, a mixture of silver flakes that are 1 micron or smaller and liquid melting point (LMP) paste is preferred. For the best results in the aforementioned paste, the amount of LMP based paste is preferably 20-50% per weight.

BRIEF DESCRIPTION OF THE DRAWINGS

A complete understanding of the present invention may be obtained by reference to the accompanying drawings, when considered in conjunction with the subsequent, detailed description, in which.

DETAILED DESCRIPTION OF THE PREFERRED EMBODIMENT

For a better understanding of the present invention, together with other and further objects, advantages, and capabilities thereof, reference is made to the following disclosure and appended claims in connection with the above-described drawings. The present invention is further described with reference to the accompanying figures where like reference numbers correspond to the same elements.

An example of an embodiment of this invention is a nano-micro conducting paste made using fifty grams of cycloaliphatic epoxy resin (e.g., one sold under product designation "ERL-4211" by the Union Carbide Corporation, Danbury, Conn.) mixed with about 50 g of hexahydro-4-methylphthalic anhydride and 0.4 g N, N dimethyl benzylamine. Further, 5 g of silver nano particles with average particle size 10-15 nanometers and 6 g of silver micro particles with average particle size five microns is thoroughly added to the mixtures. Then, 11 g of mixed silver is added to 2.5 g of the cycloaliphatic epoxy mixed solution and formed into a printable paste. A layer of this paste material is then printed onto a copper substrate. This layer is then cured at approximately 200° C. for about two hours and 240° C. for about one hour. The resistance of the cured paste is about 40 milliohms. The resistance of the paste after curing at 200° C. for about two hours is about 190 milliohms. The viscosity and conductivity of the paste has a good electrical yield (81%) and low contact resistance.

An alternative embodiment of the invention uses a mixture of LMP and silver paste. This is formed by mixing 33 g LMP paste that contains 90% conducting filler with 67 g silver paste that contains 88% in weight of silver. Next, 6 g of Propylene Glycol Methyl Ether Acetate (PGMEA) is added to the mixture. The paste mixture is then cured at 200° C. for 30 minutes.

In the present investigation, nano-micro filled conductive adhesive based 3D micro array interconnects to connect multiple electronic layers have been developed. FIG. 1 shows proposed micro arrays for connecting several electronic layers starting from chip to board. Adhesives formulated using controlled-sized particles, ranging from nanometer scale to micrometer scale, were used to form micro arrays of contact pads having diameters ranging from 5 μm to 500 μm for internal and external interconnect applications. For example, micro arrays with pads having 5-25 μm diameter are suitable for device level (chip to chip) interconnects, whereas 50-75 μm and 250 μm are suitable for chip carrier and board level interconnects, respectively.

Figure 1A:
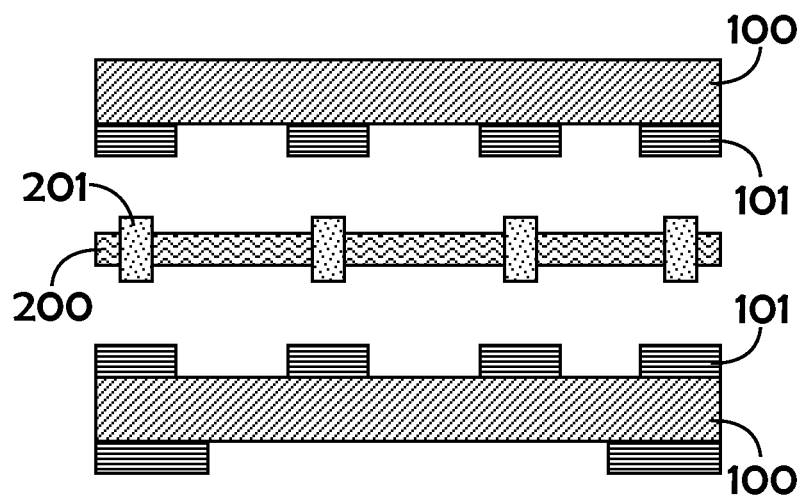
FIG. 1a shows the joining process of two devices using conducting paste filled micro arrays.
Figure 1B:
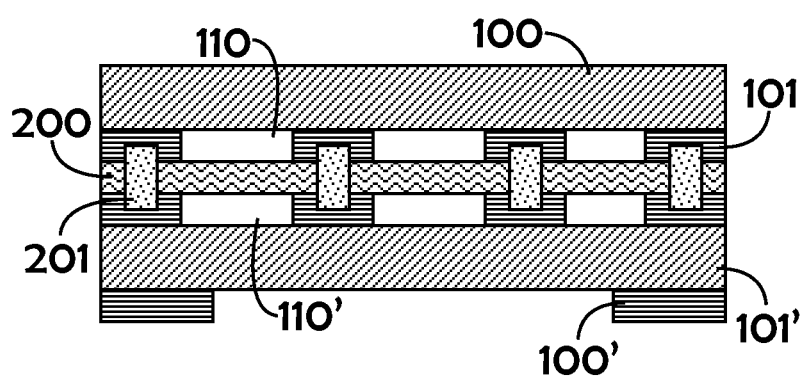
FIG. 1b illustrates joined devices using micro arrays.
Figure 1C:
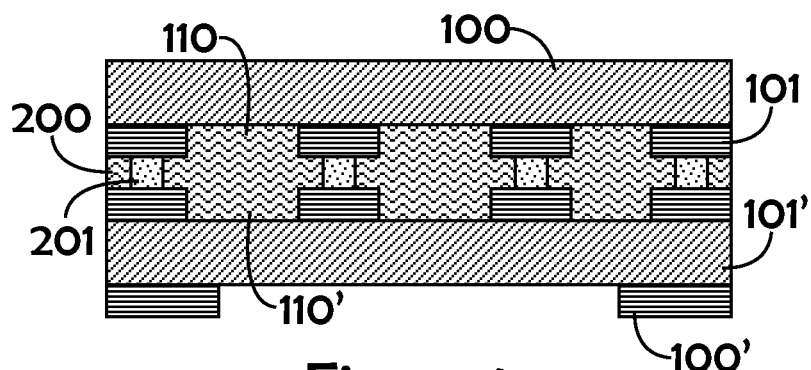
FIG. 1c also illustrates joined devices using micro arrays.

FIG. 1a represents a joining process of two devices 100, 100' using conducting paste filled micro arrays 200. Conducting paste nubs 201 are in contact with traces of the devices 101, 101' to make electrical connection. FIG. 1b represents joined devices using micro arrays. Here dielectric 200 of micro arrays did not flow and resulted in unfilled areas 110, 110' in the devices. It is also possible that dielectric 200 of micro arrays flow and can fill the traces (101, 101') and generate devices (FIG. 1c).

Figure 1D:
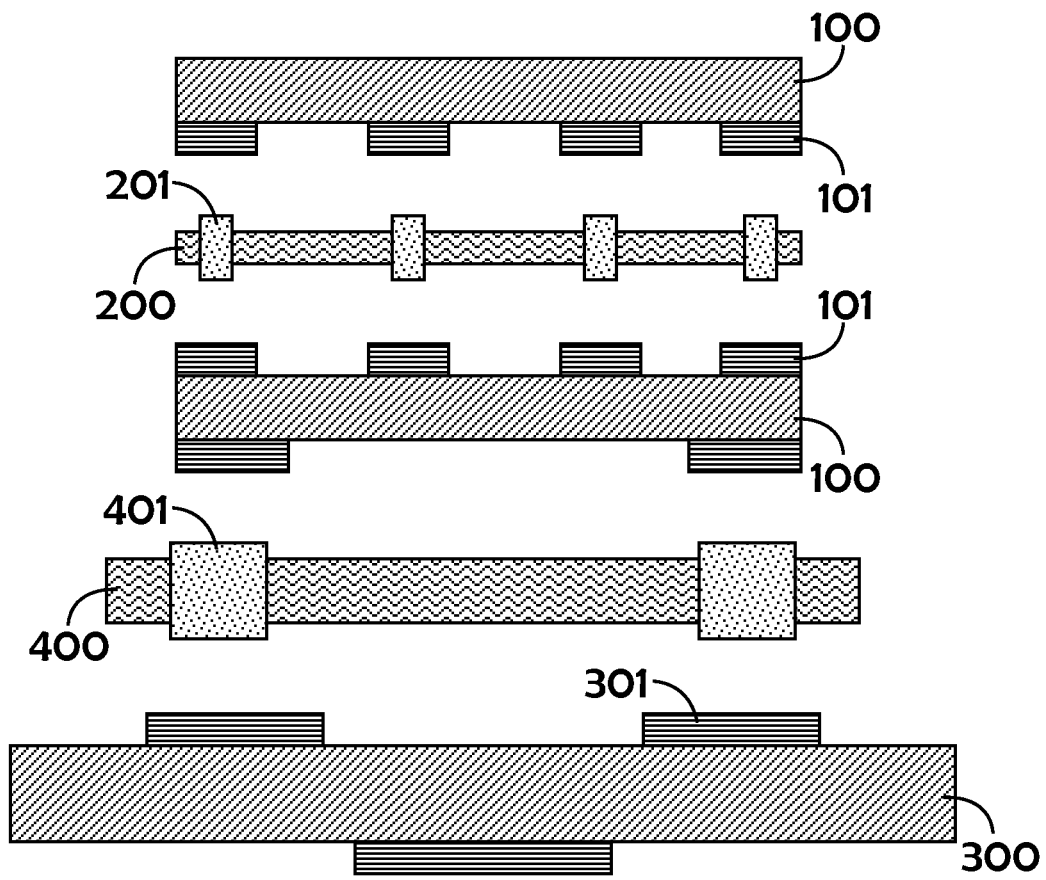
FIG. 1d illustrates devices with two different micro arrays.

Multiple micro arrays can connect multiple devices. FIG. 1d represents two different micro arrays. First micro arrays 201 are smaller in size and larger in numbers. Second micro arrays 401 are larger in size and smaller in numbers. As an example, first micro arrays 201 can connect two chips together, while second micro arrays 401 can connect chips to a chip carrier.

Figure 1E:
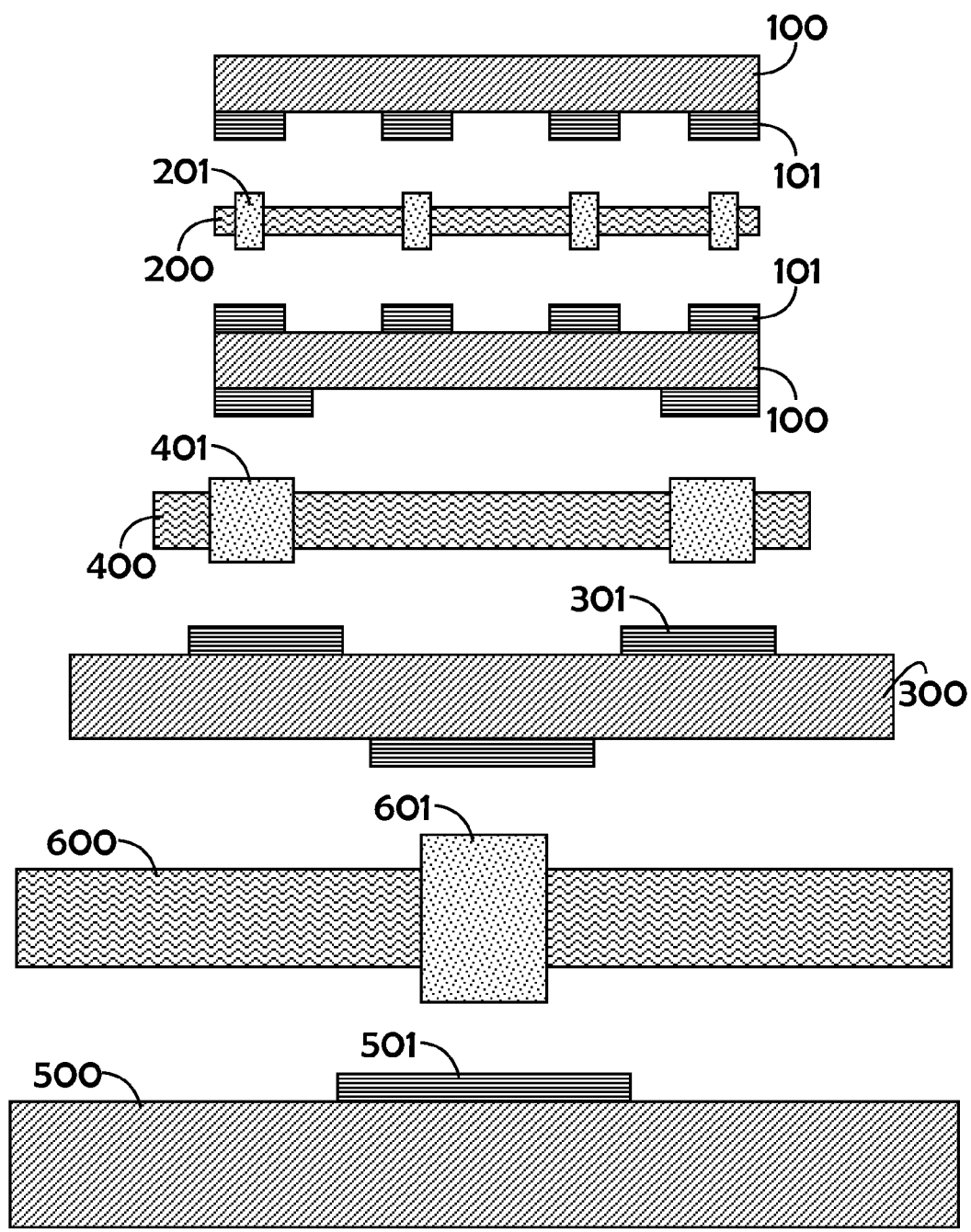
FIG. 1e shows devices with three rows of micro arrays.
Figure 1F:
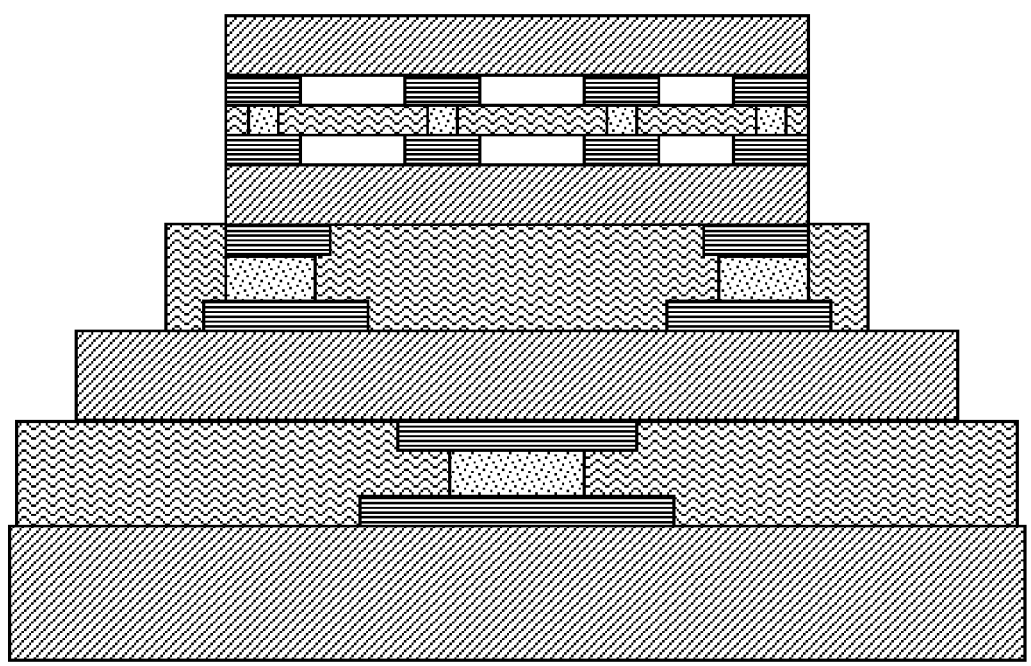
FIG. 1f represents devices using multiple micro arrays where chip circuit traces were not filled.
Figure 1G:
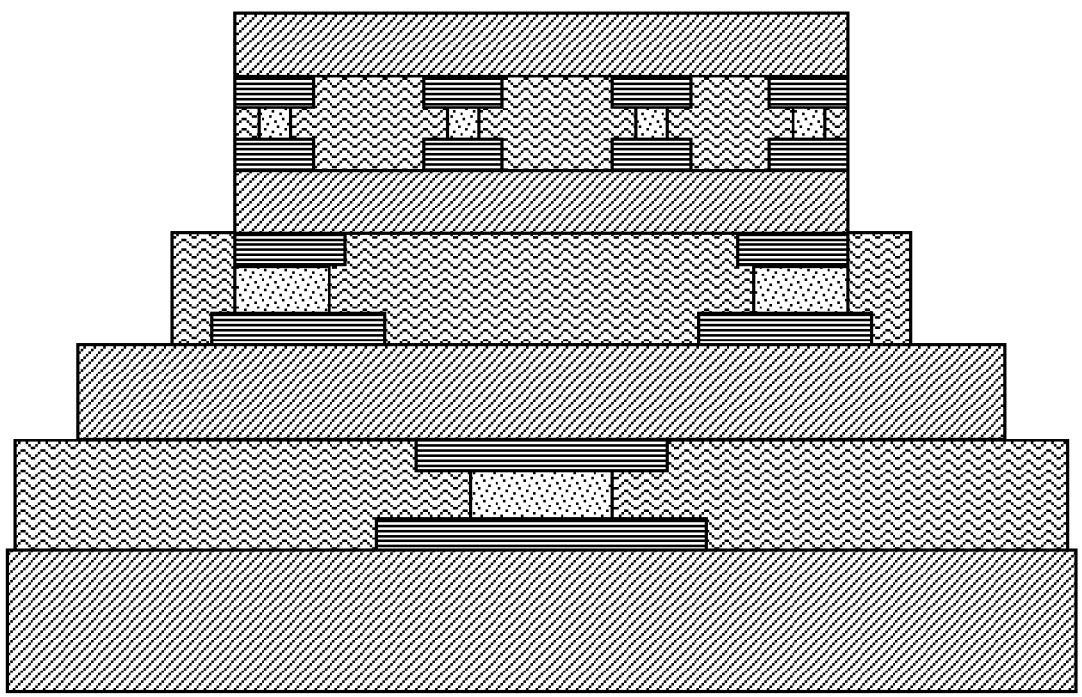
FIG. 1g represents devices using multiple micro arrays where chip circuit traces were filled with the dielectric.

Micro arrays can be further extended. FIG. 1e represents three rows of micro arrays. First micro arrays 201 can connect two chips, second micro arrays can connect chips to a chip carrier, and a third micro array 601 can connect a chip carrier to a substrate 500. Again, the number of micro arrays 201 to 601 reduces and the size of micro arrays increases from 201 to 601. For example, four micro arrays 201 of five micron size, two micro arrays 401 with 50 micron size, and one micro array with 500 micron size all require the same footprint. FIG. 1f represents devices using multiple micro arrays where chip circuit traces 101, 101' were not filled. FIG. 1g represents devices using multiple micro arrays where chip circuit traces 101, 101' were filled with dielectric 200.

Figure 2A:
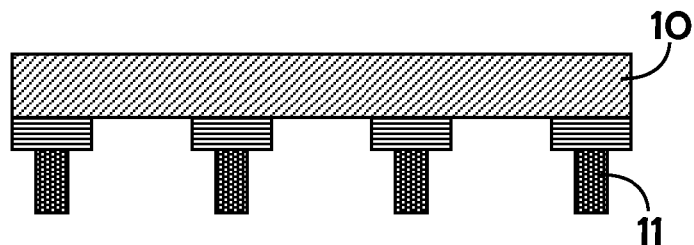
FIG. 2a is a cross-sectional view of micro pillar connects located on the surface of a sensor.
Figure 2B:
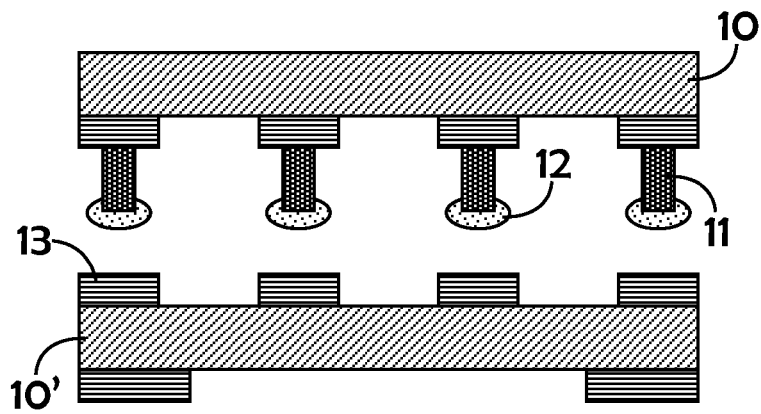
FIG. 2b depicts a joining of a sensor surface with another device using the conducting paste dip micro pillar.
Figure 2C:
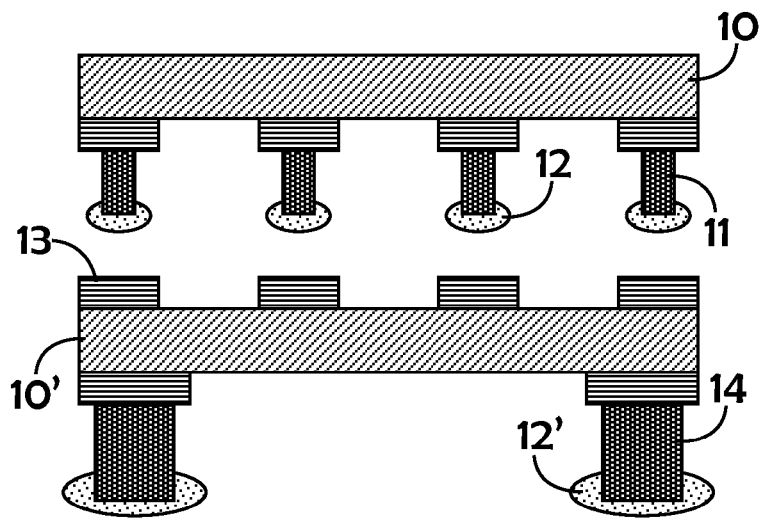
FIG. 2c represents joining of multiple devices using a conducting paste micro pillar.

FIG. 2a is a cross sectional view of micro pillar connects 11 located on the surface of a sensor 10. FIG. 1b depicts a joining of the sensor surface with another device 10' using conducting paste 12 dip micro pillar 11. FIG. 1c represents joining multiple devices using a conducting paste and micro pillar where both first device 10 and second device 10' use conducting paste dip micro pillar for joining. First micro pillars 11 are smaller in size and larger in numbers. Second micro arrays 14 are larger in size and smaller in numbers. For example, 11 micro pillars can connect two chips together, and 14 micro pillars can connect chips to a chip carrier.

Figure 2D:
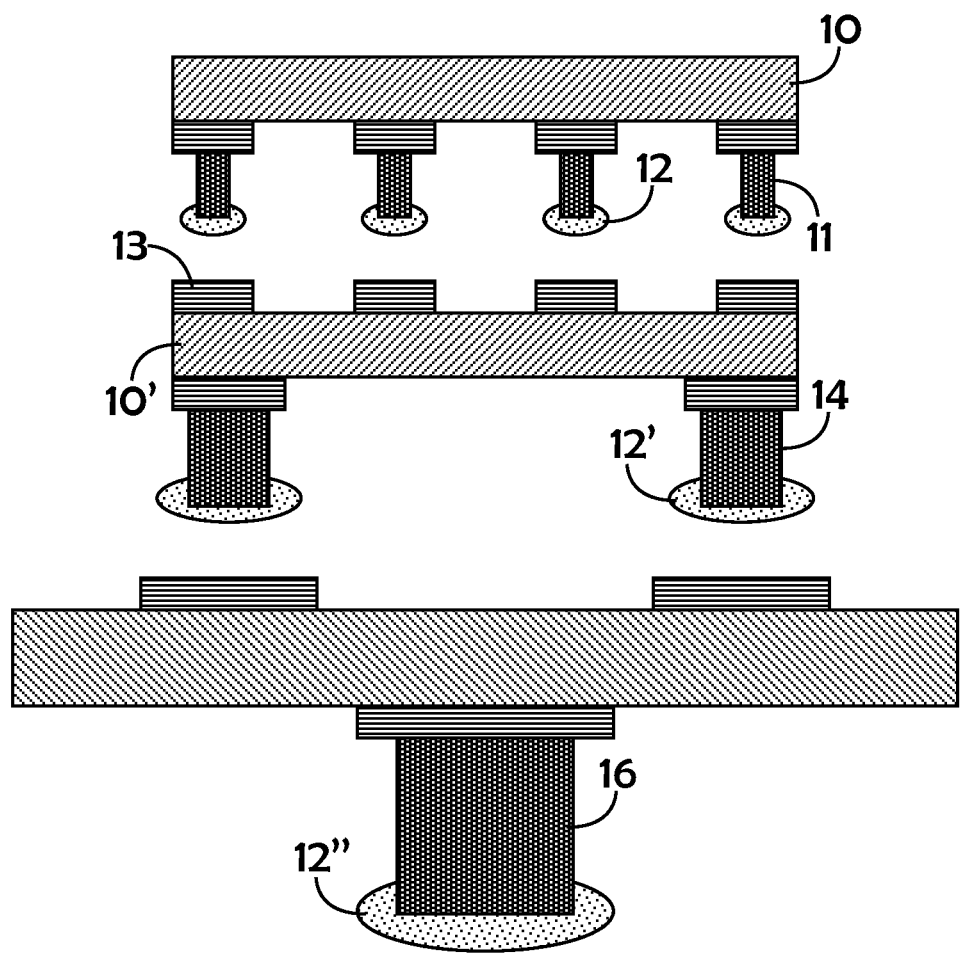
FIG. 2d represents devices with three rows of micro pillars.
Figure 2E:
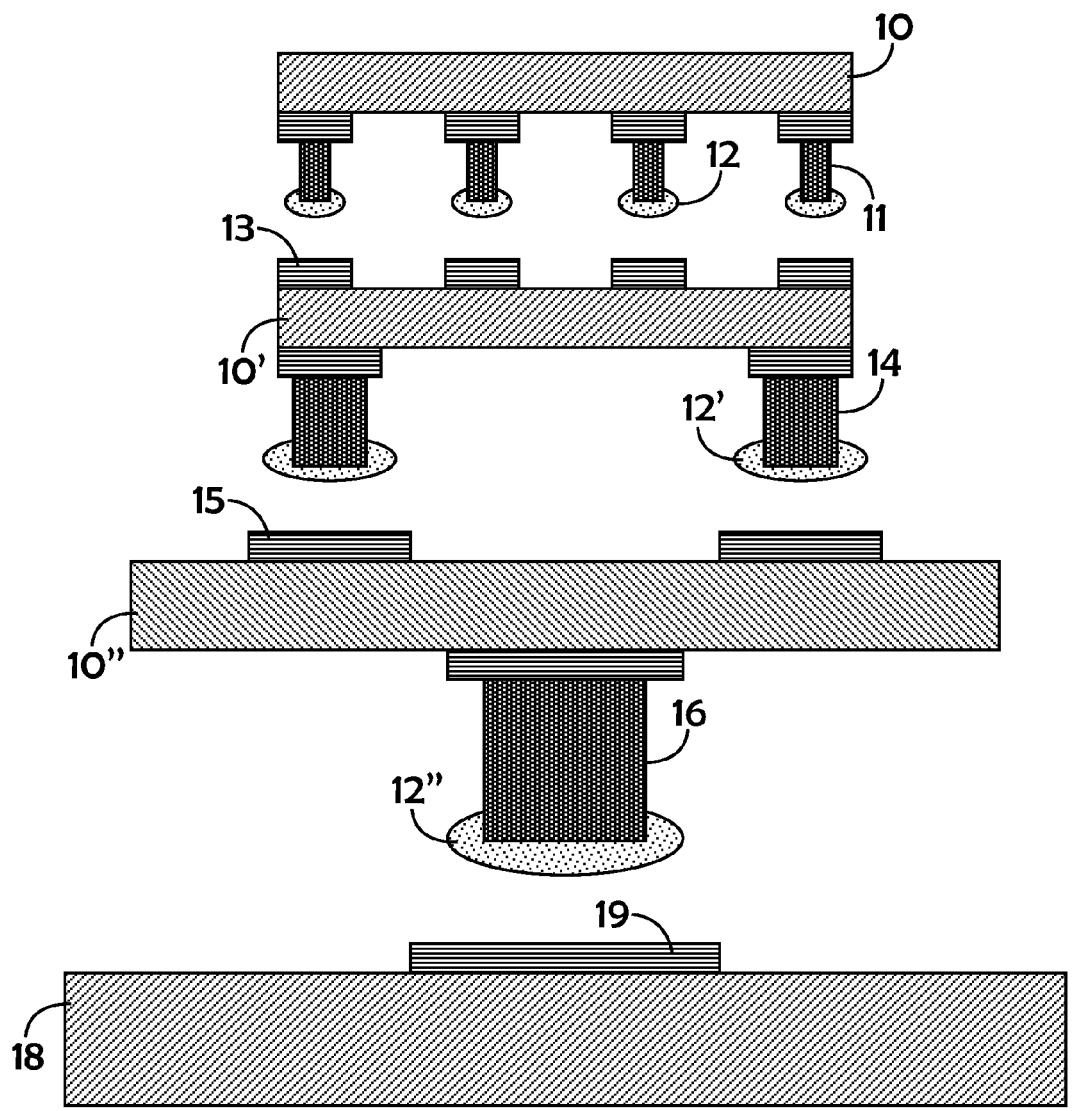
FIG. 2e represents joining of multiple devices using micro pillars.

Micro pillars can be further extended. FIG. 2d represents three rows of micro pillars. Micro arrays 11 can connect two chips, micro arrays 14 connect chips to a chip carrier 10" and micro arrays 16 connect chip carriers to a substrate 18. Again, the number of micro arrays from 11 to 16 reduces and the size of micro arrays increases from 11 to 16. For example, four micro pillars 11 of five micron size, two micro pillars 14 with 50 micron size and one micro pillar 16 with 500 micron size require the same footprint. FIG. 2e represents joining of multiple devices using micro pillars.

Figure 2F:
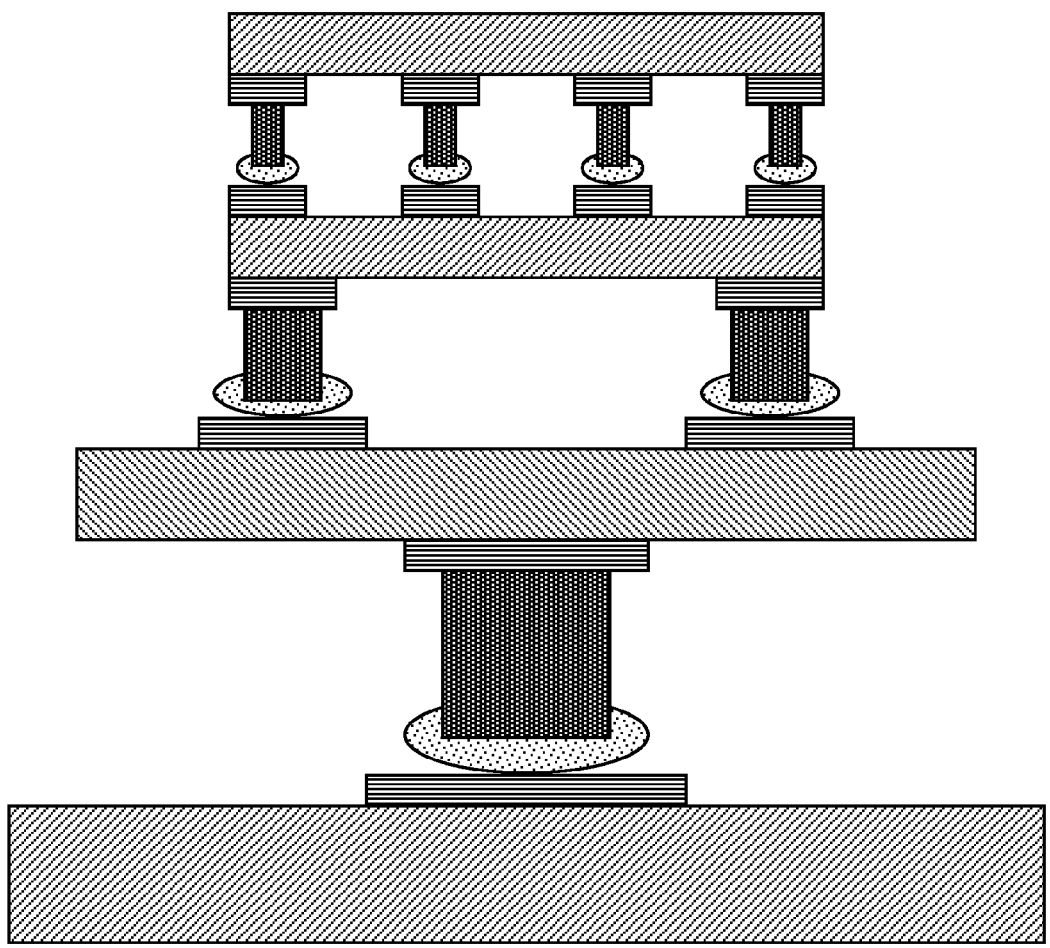
FIG. 2f shows extended assembled devices.
Figure 3:
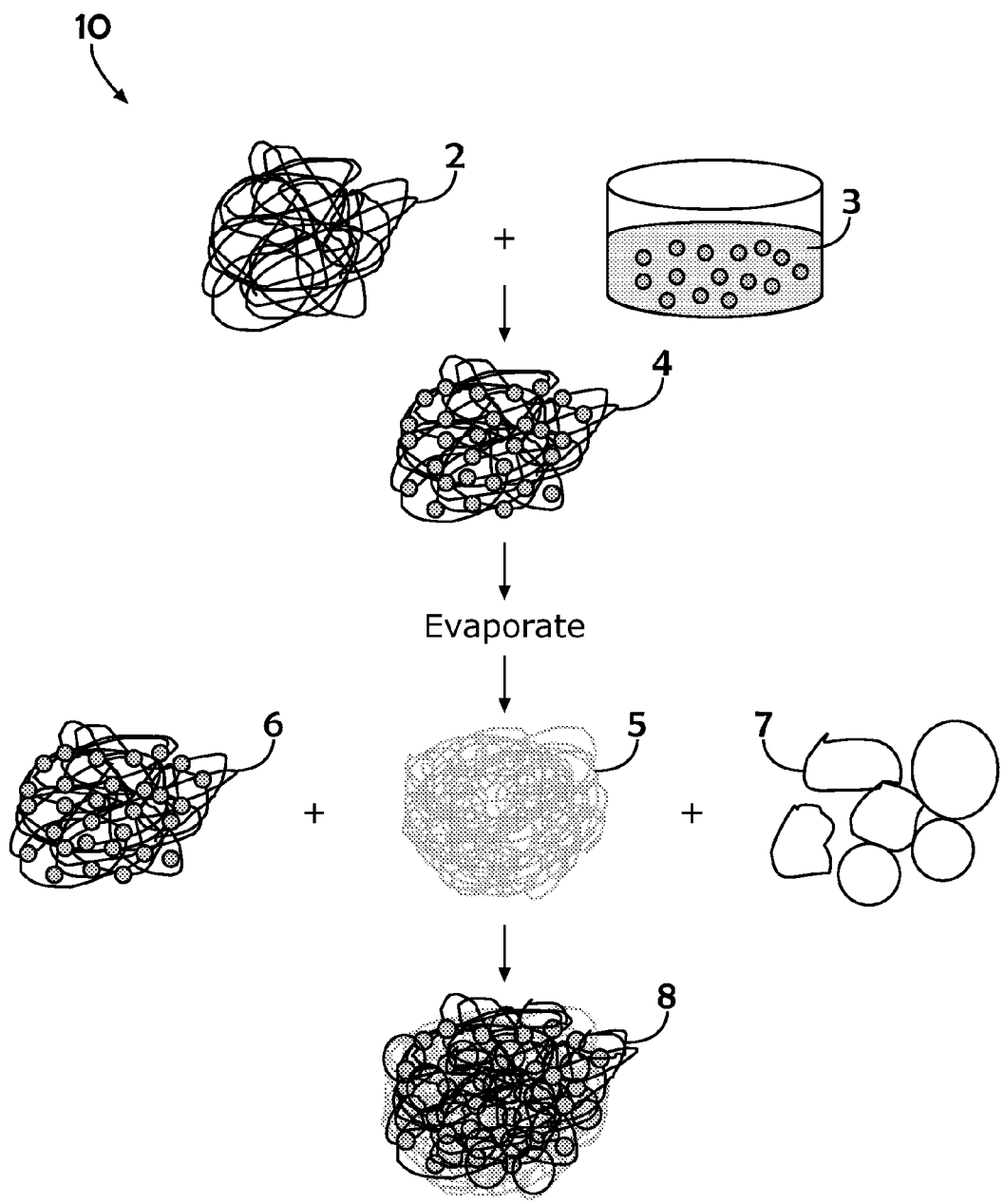
FIG. 3 is a representation of the inventive method to form one of the embodiments of the conducting paste for device level interconnects called the nano-micro paste.

In another aspect, instead of conductive adhesive, the tips of pillars can be plated with tin or tin-lead or tin-bismuth or any other metal or alloy that melts and forms an electrical joint. It is also possible to use conducting adhesive along with tin or tin-lead or tin-bismuth or any other metal or alloy plated pillars. FIG. 2f shows extended assembled devices (e.g., infrared camera or computer) whose interconnects, such as the sensor in FIG. 2a, have been assembled with conducting paste. The sensor fabrication involves the use of the conducting paste to make a connection from the sensor to the processor, causing an excellent interconnection that has good electrical yield and low contact resistance.

Nanoparticle generally refers to the class of ultra fine metal particles with a physical structure or crystalline form that measures less than 100 nm in size. They can be 3D (block), 2D (plate), or 1D (tube or wire) structures. In general, nanoparticle-filled conductive adhesives are defined as adhesives containing at least some percentage of nanostructures (1D, 2D, and/or 3D) that enhance the overall electrical conductivity or sintering behavior of the adhesives. Conductivity is achieved through metal-metal bonding. Increasing the density of particles increases the probability of metal-metal contact. Each contact spot possesses a contact resistance. For microparticles, the density of particles is much less than for nanoparticles. In the case of a nano-micro mixture, the microscale particles can maintain a low contact resistance, whereas nano-scale particles can increase the number of particle contacts. Nano- and microparticle mixtures can be nanoparticle-microparticle, nanoplate (2D)-microparticle, nanotube (1D)-microparticle, or any combination of these three cases. A low melting point (LMP) filler melts and reduces inter-particle resistance. Hence, conductive adhesives can be categorized as nano, micro, nano-micro, or LMP based systems.

With reference to FIG. 4, the method of forming one embodiment, nano micro paste 10, is shown. A resin or part of a resin component 2 is mixed with a silver or any other (Au, Pt, etc.) nano particle solution in low temperature boiling solvent 3. The solvent 3 is then evaporated from the mixture 4, leaving a mixture of resin with embedded nano particles 5. The resin with embedded nano particles 5 is mixed with another component such as an anhydride or cross linking agent 6 and dry micro powder 7 to form the nano micro paste 8. If necessary, a catalyst can added to nano-micro paste 8. This kind of paste can maintain very fine nano particles in the paste. In general, 5 nm Ag nanoparticles sinter at room temperature to form larger particles. In nano-micro paste 8, 5 nm particles are stable at room temperature and can utilize the low temperature sintering impact of the paste during the curing processing.

Figure 4A:
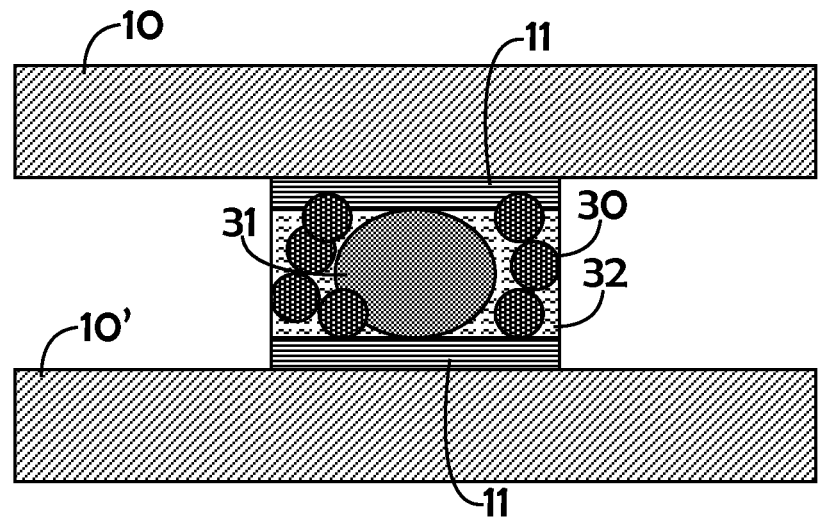
FIG. 4a shows LMP and nanoparticles present in selective areas forming selective bonding with paste bonding prior to paste curing.

FIG. 4a shows nanoparticles 30 rich and LMP 31 rich paste wrapped with a polymer 32.

Figure 4B:
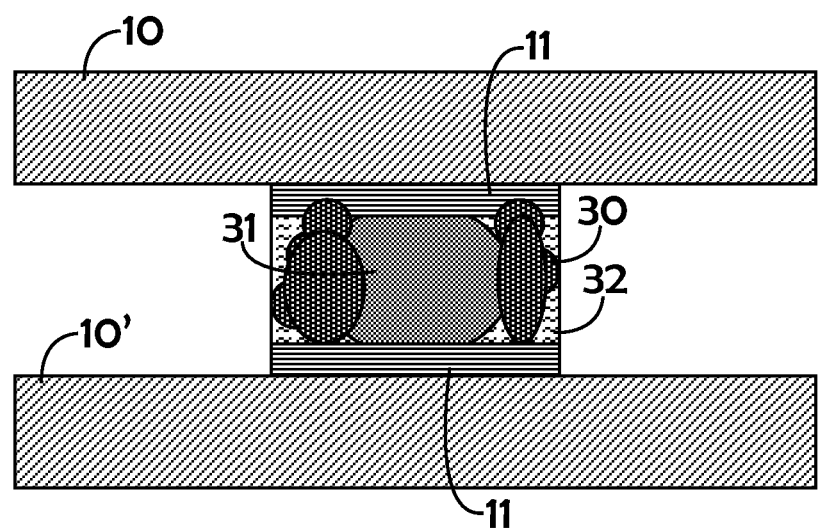
FIG. 4b shows LMP and nanoparticles present in selective areas forming selective bonding with paste bonding after paste curing and nanoparticles have been sintered and LMP melted to form bonding.

FIG. 4b shows cured paste where nano particles sinter selectively and LMP melts in selective areas to form a robust bond. Nanoparticles mixtures can be nano-micro particle mixtures. Similarly LMP can be large particles or a mixture of small particles.

FIGS. 4a and 4b are cross sectional views of uncured and cured paste with two electrical pads.

Sintering temperature can be reduced greatly when the particle size is decreased to 10-15 nanometers. Conductivity measurements show that the resistance for 10-15 nm particles is 85% lower when cured at 200° C. than it is when cured at 150° C. A variety of nanoparticles ranging from 10 nm to 80 nm was used to modify micro adhesive composites. Particle size has a direct effect on particle diffusion/sintering. Sintering of a system containing 10-15 nm particles starts at 200° C. Nanoparticles are sintered, but some microparticles remain unsintered. The sintering process completes at 240° C., when all particles are sintered. In the nano-micro composites, the main components are a mixture of nanoparticles and microparticles. The nanoparticles may contact with adjacent ones, but the nano aggregation lengths are short, less than one order of magnitude of the microparticle diameter, on average. As the sintering temperature increases, particle diffusion becomes more and more obvious. The aggregation length becomes much longer, resulting in the formation of one-dimensional jointed particle assemblies developing into a smooth continuous network (FIG. 4b). The addition of in-situ nanoparticles reduces the sintering temperature without compromising electrical conductivity. Direct deposition of in-situ nanoparticles on microparticle surfaces reduces sintering temperature to around 200° C., and produces a continuous metallic network (FIG. 4b). For in-situ depositions, nanoparticles occupy the surface of micro particles, have more chance to react/diffuse with each other to make a uniform metallic network, and thus maintain low temperature sintering like pure nanoparticle systems.

Since other combinations, modifications and changes varied to fit particular operating requirements and environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

What is claimed is:

1. An electrically conducting, dual paste mixture for connecting device level interconnects, comprising:
   a first conducting paste having a set of sinterable particles selected from the group consisting of micro particles, nano particles, or a combination thereof embedded in a first resin system;
   a second conducting paste having a set of low melting point micro particles;
   wherein said first and second pastes are intermixed so that said set of sinterable particles and said set of meltable particles remain segregated from each other at a microscopic level and said set of sinterable particles remain sinterable and said meltable particles remain meltable.

2. The conducting, dual paste mixture of claim 1, wherein said second conducting paste contains at least one alloy having a melting point no greater than 200° C.

3. The conducting, dual paste mixture of claim 2, wherein said first conducting paste contains noble metal fillers.

4. The conducting, dual paste mixture of claim 3, wherein said noble metal fillers are chosen from the group: gold and silver flakes.

5. The conducting, dual paste of claim 4, wherein said noble metal fillers comprise an average flake size no greater than 5 microns.

6. The conducting, dual paste mixture of claim 4, wherein said first conducting paste and said second conducting paste maintain their respective micro level characteristics even after final curing.

7. The conducting, dual paste of claim 3, wherein said noble metal fillers comprise an average flake size no greater than 5 microns.

8. The conducting, dual paste mixture of claim 3, wherein said first conducting paste and said second conducting paste maintain their respective micro level characteristics even after final curing.

9. A method of forming an electrically conducting, dual paste mixture with metal loading in the range of 85-95% useful for connecting micron device level interconnects, the method comprising:

a) embedding a nano particle within a polymer constituent by adding a resin to a silver nano particle solution in a solvent;
b) dissolving said polymer constituent containing said nano particles in said silver nano particle solution and evaporating said solvent to form an embedded nano particle polymer wherein said polymer constituent wraps the nano particles to embed said particles within said polymer constituent;
c) combining said embedded nano particle polymer constituent with dry micro powder and an anhydride; and
d) fully mixing said embedded nano particle polymer, anhydride, and micropowder.

\* \* \* \* \*